(12) United States Patent
Drotleff

(10) Patent No.: US 8,564,379 B2
(45) Date of Patent: Oct. 22, 2013

(54) DEVICE AND METHOD FOR TESTING A FREQUENCY-MODULATED CLOCK GENERATOR

(75) Inventor: Hans-Georg Drotleff, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 136 days.

(21) Appl. No.: 13/059,012

(22) PCT Filed: Aug. 25, 2009

(86) PCT No.: PCT/EP2009/060921
§ 371 (c)(1),
(2), (4) Date: Feb. 14, 2011

(87) PCT Pub. No.: WO2010/043439
PCT Pub. Date: Apr. 22, 2010

(65) Prior Publication Data
US 2011/0140740 A1    Jun. 16, 2011

(30) Foreign Application Priority Data

Oct. 15, 2008 (DE) .......................... 10 2008 042 847

(51) Int. Cl.
*H03K 7/08* (2006.01)
(52) U.S. Cl.
USPC ........... 332/109; 332/117; 332/118; 375/130; 375/238; 713/500
(58) Field of Classification Search
CPC ....................................................... H03B 29/00
USPC ............ 331/78; 327/156; 375/376, 130, 238; 332/127, 109, 123, 117, 118; 713/500
See application file for complete search history.

(56) References Cited

U.S. PATENT DOCUMENTS

| 5,506,545 A * | 4/1996 | Andrea ........................... 331/78 |
| 5,748,670 A | 5/1998 | Zastrow |
| 8,085,101 B2 * | 12/2011 | Yamamoto et al. ............. 331/78 |
| 2003/0132775 A1 | 7/2003 | Yamanaka et al. |
| 2005/0008113 A1 * | 1/2005 | Kokubo et al. ................ 375/376 |
| 2005/0057241 A1 | 3/2005 | Ono et al. |
| 2006/0268971 A1 | 11/2006 | Watabe |

FOREIGN PATENT DOCUMENTS

| DE | 10 2005 013 593 | 9/2006 |
| JP | 2003-324350 | 11/2003 |
| JP | 2007 078617 | 3/2007 |

* cited by examiner

Primary Examiner — Arnold Kinkead
(74) Attorney, Agent, or Firm — Kenyon & Kenyon LLP

(57) ABSTRACT

A method and a device are described for testing a frequency-modulated clock generator, the device including a cycle counting unit for counting clock cycles of a clock signal of the clock generator in multiple consecutive measuring periods, which are defined, in particular, by a measuring signal having a measuring frequency, and for outputting cycle count values, and including a comparator device for receiving and comparing the cycle count values with each other and for outputting at least one output signal as a function of the comparison. In particular, ascertained maximum and minimum values may be compared with each other.

27 Claims, 9 Drawing Sheets

DEVICE AND METHOD FOR TESTING A FREQUENCY-MODULATED CLOCK GENERATOR

FIELD OF THE INVENTION

The present invention relates to a method and a device for testing a frequency-modulated clock generator.

BACKGROUND INFORMATION

Electromagnetic interference (EMI) is subject to strict regulations. EMI limiting values are defined to minimize harmful exposure and thereby avoid damage to people and other systems. The limiting values may apply, in particular, to the intensities which electronic equipment or systems are allowed to radiate within each frequency range.

Clock generators are generally designed as integrated circuits (ICs), and they are used in electronic systems to output a clock signal. In particular, they are designed as oscillators or frequency synthesizers and output a clock signal having a nominal frequency or mid-frequency. Although clock generators play an important role in maintaining the proper operation of most digital systems, they are also the main sources of electromagnetic interference in electronic circuits.

Therefore, an important goal in the development of digital systems which use clock signal-generating or frequency-generating components in their systems is to reduce or limit electromagnetic radiation.

Among other things, shielding, coatings or special filter components are known for reducing electromagnetic radiation. Due to the increasingly higher power densities, in particular ever higher clock rates as well as increasingly stricter electromagnetic interference regulations, measures of this type, however, are reaching their limits in terms of efficiency and cost.

To limit the peak emissions, spread spectrum oscillators (SSO) are therefore being used more and more. These oscillators spread their clock signals over a broader frequency spectrum and thus limit the peak emissions with regard to the individual frequency ranges. This spread is generally achieved by a frequency modulation having a modulation frequency which lies far below the clock frequency. The modulation signal may have, for example, a triangular form or also another suitable form. Due to SSOs of this type, it is possible, for example, to reduce peak emissions by up to 20 dB. A spread spectrum oscillator is known, for example, from the German unexamined patent application DE 10 2005 013 593 A1.

The cycle-to-cycle jitter common in oscillators, which generally produces even much greater fluctuations than does frequency modulation, and yet is averaged over only a few clock cycles, is superimposed on the frequency modulation.

Frequency modulation is generally achieved by a supplementary circuit; however, it is not possible to directly determine during operation whether this frequency modulation is working properly. Furthermore, it is not possible to easily determine in an electronic system whether an SSO was in fact installed or, for example, if a fixed-frequency oscillator was erroneously installed. In this case, substantial electromagnetic pollution of the environment may occur without it being possible to directly detect this situation in the device, i.e., electronic device.

Although methods and systems are known, in principle, for checking proper frequency modulation of an SSO, for example using FM demodulation and subsequently evaluating the modulation signal, or using a frequency spectrum analyzer. However, measures of this type are complex and require extensive measuring equipment. They may also not be easily adapted to an existing production inspection system.

SUMMARY OF THE INVENTION

According to the method according to the present invention as well as the device according to the present invention, the clock cycles of the clock generator, in particular those of an SSO, are counted within a measuring period. The measuring periods may be, in particular, fixedly specified to achieve directly comparable values; in principle, however, they may also be adapted during the measurement; for example, the measuring period may be subsequently adapted as a function of the ascertained modulation frequency. The count values or cycle count values ascertained over multiple measuring periods are subsequently compared; in particular, they may be compared with each other. The frequency modulation to be tested thus results in a change in the cycle count values in consecutive measuring periods.

The exemplary embodiments and/or exemplary methods of the present invention are based on the idea that the modulation frequency of a frequency-modulated clock generator, in particular that of an SSO, is much lower than the mid-frequency of the clock generator. According to the exemplary embodiments and/or exemplary methods of the present invention, individual clock cycles or clock oscillations are thus counted within one measuring period by a counter, namely the cycle counter, which, in particular, is digital and ascertains the cycle count values. Based on the frequency modulation, the number of clock cycles occurring within fixed measuring periods should vary; if a frequency modulation fails to occur, this should result in fixed or slightly fluctuating values.

The measuring periods are advantageously defined by a measuring signal having an appropriate measuring frequency. To satisfy the sampling theorem, the measuring frequency should be at least twice as high as the modulation frequency. It may advantageously be two to seven times the modulation frequency. If too high a measuring frequency is selected, the quantitative ascertainment of the modulation frequency, and thus that of the spread, in turn, is made more difficult.

The cycle counter may be reset, in particular, directly by the measuring signal. A simple measurement setup is possible which includes direct ascertainment of the different cycle count values or cycle counter contents which are subsequently read out over multiple measuring cycles or measuring periods to achieve the minimum and maximum possible cycle count values. For this purpose, buffer memories or intermediate buffers may be used which are overwritten by the particular maximum or minimum ascertained cycle count value. The ascertained minimum and maximum values may thus be subsequently evaluated, for example via double buffering using additional result buffers.

Ascertainment or evaluation may then take place following an evaluation period which includes multiple, for example 240 or 256, measuring periods, so that the minimum and maximum values should have been reached due to the adequate number of periods.

The spread may be quantitatively ascertained therefrom. Furthermore, the nominal frequency, i.e., generally the mid-frequency, may also be ascertained.

Other advantageous embodiments result, for example, from the use of a number of measurements counter for counting the number of measuring periods and, if necessary, from the use of a monitoring counter or watchdog counter. The result may be output, for example, in binary form or as a PWM signal and used directly in a system.

The method according to the present invention and the device according to the present invention may be implemented in different ways. In particular, they may be implemented in a programmable logic unit, for example an FPGA or ASIC. Such implementation in an IC requires relatively low hardware complexity and a small chip area which, for example, may be essentially formed by the cycle counter, the intermediate buffer, if necessary, input and output flip-flops, a logic circuit and, if necessary, a clock conditioner for the clock generator signal to be received and tested. If necessary, an internal oscillator or clock generator may furthermore be provided for generating the measuring frequency, for example, also an existing internal clock signal, this system making it possible to switch between this internal clock generator and an external measuring signal, for example using an internal switching unit. Furthermore, the device according to the present invention may be already integrated together with the clock generator or SSO.

Further embodiments are provided as independent testing arrangement, in which the device according to the present invention and any further components are mounted on a circuit carrier and also provided, for example, as a peripheral module in a microcontroller. The output of the measurement result is dependent on the form of implementation or on the product version.

DETAILED DESCRIPTION

Figure 1:
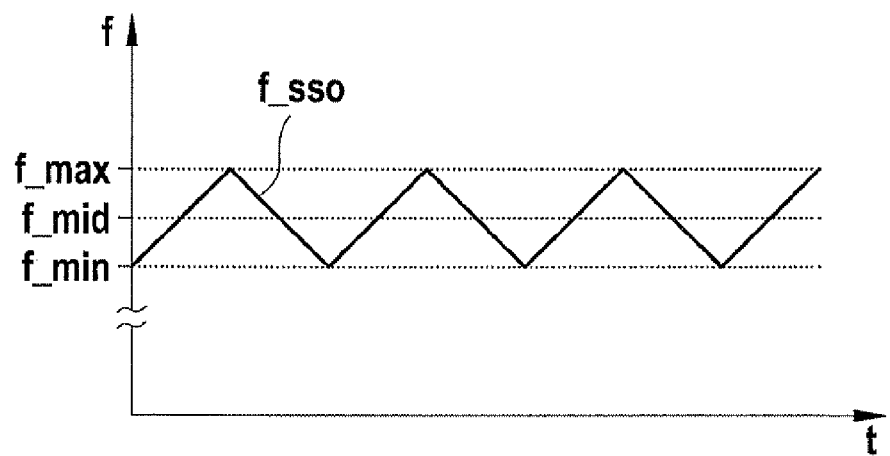
FIG. 1 shows a modulation profile of a spread spectrum oscillator in the form of a frequency as a function of time.

In the specific embodiments illustrated, a frequency-modulated clock generator according to the present invention may be implemented as an SSO (spread spectrum oscillator). FIG. 1 shows the modulation profile of an SSO as a function of frequency f plotted against time t. Mid-frequency $f\_mid$ is fixed in this case; to distribute the electromagnetic radiation over a larger frequency range, a modulation profile is set up according to FIG. 1, according to which f is periodically modulated between a lower value $f\_min$ and an upper value $f\_max$, for example according to the triangle line, i.e., having a linear rise and fall of frequency f between $f\_min$ and $f\_max$. In principle, other modulations are also possible.

Figure 2:
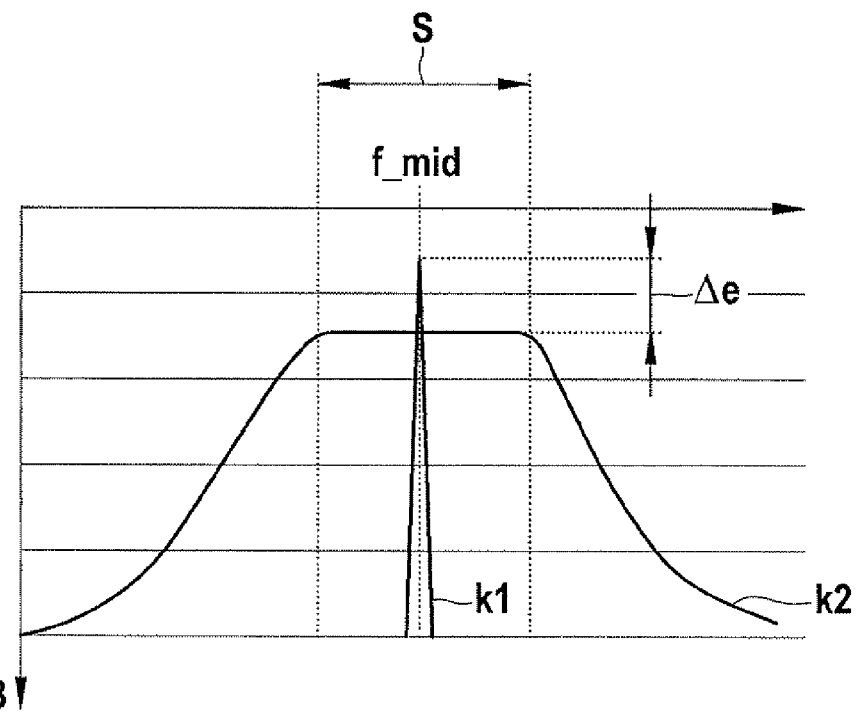
FIG. 2 shows electromagnetic frequency spectra of an oscillator having and not having frequency modulation.

FIG. 2 shows an electromagnetic frequency spectrum, i.e., the electromagnetic radiation as intensity I as a function of frequency f, in the range of the ninth harmonic wave of clock oscillators, curve k1 showing an oscillator having non-modulated frequency f, and curve k2 showing a spread spectrum oscillator 1. This results in a reduction in the peak emission of spread spectrum oscillator 1 over the non-modulated oscillator, this reduction being plotted as Δe. Intensity I, which is indicated in decibels (dB), gradually decreases outside the spread.

Figure 3:
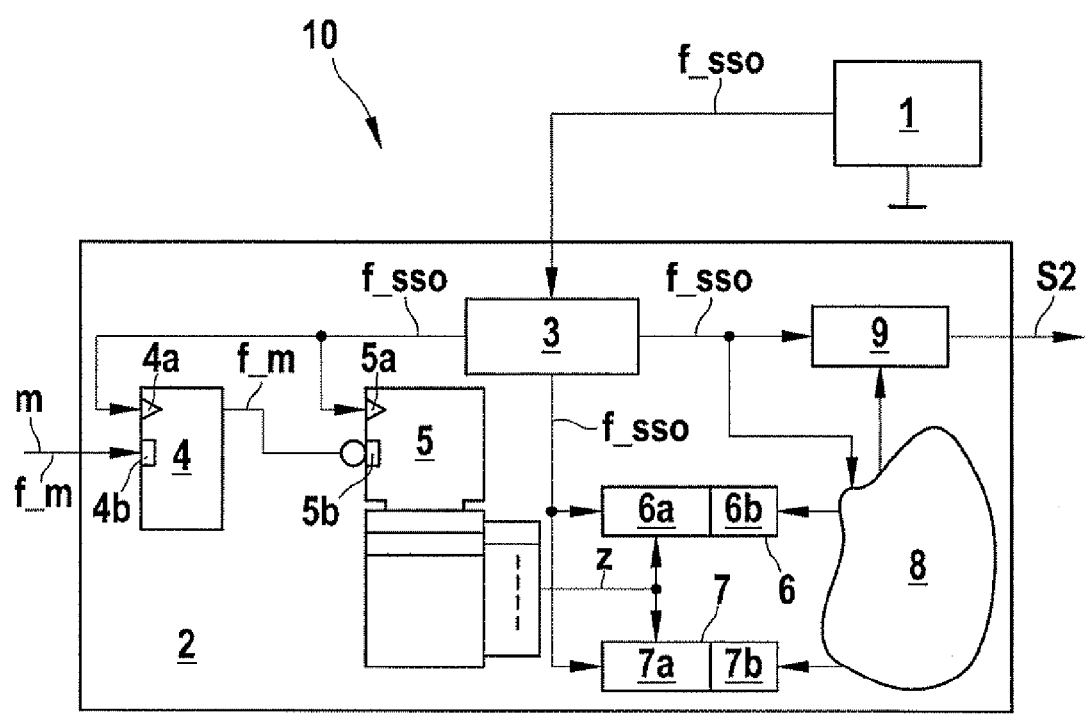
FIG. 3 shows a block diagram of an FPGA implementation of the device according to the present invention.

FIG. 3 shows a highly simplified representation of the implementation of the method according to the present invention as well as of the device according to the present invention in an FPGA (field programmable gate array) 2. An external SSO 1 receives a clock signal to be tested, having a signal frequency $f\_sso$—the clock signal is also hereinafter referred to directly as $f\_sso$; signal frequency $f\_sso$ is formed, for example, by superimposing a mid-frequency $f\_mid=33.33$ MHz and a modulation frequency $f\_mod=10$ kHz, and it has, for example, a spread of +/−2%. Overall system 10 from FIG. 3 is thus formed by FPGA 2 and SSO 1. The clock signal to be tested is supplied to a clock conditioning unit 3 in FPGA 2, which outputs an appropriately conditioned clock signal having the same frequency $f\_sso$ which is input into clock input 4a of a flip-flop 4, on the one hand, and into clock input 5a of a (digital) cycle counter 5, on the other hand.

A measuring signal m having measuring frequency $f\_m$ is input into input 4b of flip-flop 4 and output, in turn, by flip-flop 4 as a second measuring signal having same measuring frequency $f\_m$; flip-flop 4 is thus used only for stabilization purposes and has no further functional relevance. Measuring signal m is input into reset input 5b of cycle counter 5 and thus resets this counter.

SSO frequency $f\_sso$ to be tested is thus counted in cycle counter 5 (in this specific embodiment, following appropriate conditioning in clock conditioning unit 3) over a fixed measuring period $T\_m$ which is determined by externally input measuring signal m having measuring frequency $f\_m$, which resets cycle counter 5 in each case. Measuring frequency $f\_m$ of, for example, 50 kHz is higher than modulation frequency $f\_mod$ of 10 kHz, so that multiple measuring cycles or cycle count values of cycle counter 5 may be output during one modulation. The cycle count values are the end count values before cycle counter 5 is reset. If a modulation is, in fact, present, i.e., if $f\_mod \neq 0$ applies, cycle counter 5 outputs different cycle count values as signal z, depending on the point in the oscillation modulation curve at which the count period lies, viewed in the time domain. If no modulation is present, these values should be equal in each case during the different output cycles or reset cycles.

Cycle counter 5 supplies its counter contents in each measuring period $T\_m$ as signal z (cycle count value z) to an upper buffer memory 6 and a lower buffer memory 7. Upper buffer memory 6 includes a maximum intermediate buffer 6a for storing a maximum value as well as a downstream result buffer 6b; similarly, lower buffer memory 7 includes a minimum intermediate buffer 7a for storing a minimum value, and also includes a result buffer 7b. Maximum intermediate buffer 6a is preinitialized with value 0x0000, and minimum intermediate buffer 7a is preinitialized with value 0xFFFF. In each measuring period $T\_m$, these intermediate buffers 6a, 7a are overwritten by new cycle count value z, provided that this value is less than the instantaneous value in minimum intermediate buffer 7a or greater than the instantaneous value in maximum intermediate buffer 6a. Intermediate buffers 6a, 7a are also timed by clock frequency f_sso.

Upon completing a suitable number of counting periods, for example 256, the values of intermediate buffer 6a, 7a are each saved in downstream result buffer 6b, 7b, which as such is known as double buffering. This ensures that intermediate buffers 6a, 7a may be changed from one counting period to another, while result buffers 6b, 7b may be updated only after intermediate buffers 6a, 7a have stabilized or reached their steady states or minimum or maximum counter contents. Only result buffers 6b, 7b are taken into account when outputting the result, so that a stable display is achieved. An evaluation period including an adequate number of measuring periods is thus formed.

An evaluation unit 8 is designed as a logic unit; it accesses result buffers 6b, 7b and outputs a result to an output memory, for example an output flip-flop 9, which subsequently outputs output signal S2 as a status output signal. Output flip-flop 9 and evaluation unit 8 are also timed by clock frequency f_sso.

Figure 3A:
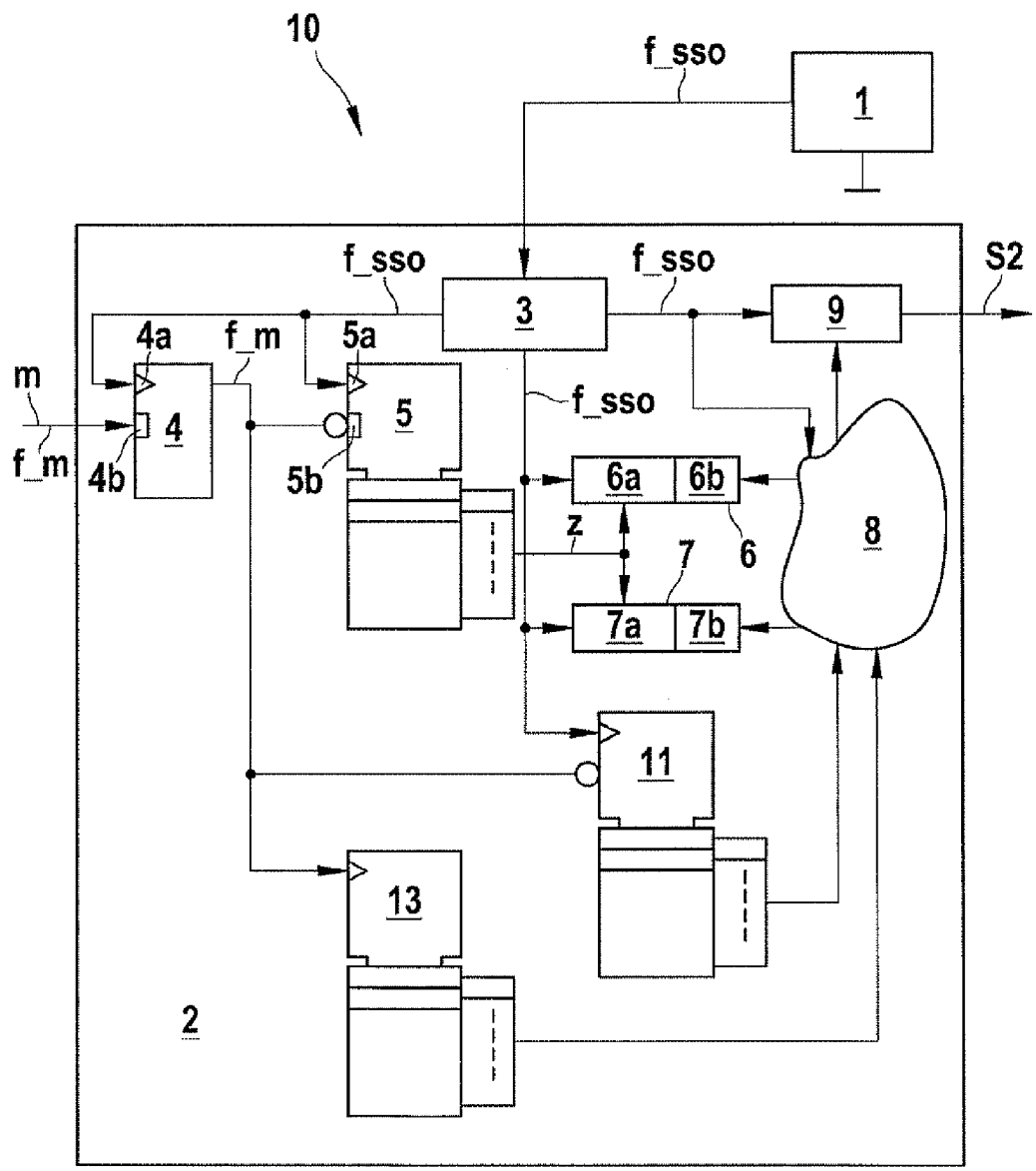
FIG. 3a shows a block diagram of a further FPGA implementation of the device according to the present invention.

According to FIG. 3a, a number of measurements counter 13 may also be provided, which counts the number of measuring periods T_m, i.e. the counter periods, and is thus used to define the evaluation period. After a suitable number of measuring periods T_m, for example, 256, intermediate buffers 6, 7 have stabilized or reached their steady state and correlate with the minimum or maximum frequency of SSO 1, so that the difference between buffered minimum and maximum values Zmin and Zmax of cycle counter 5 correlate with the spread of SSO 1.

In an SSO 1 having center spread modulation, the mean value [Zmin+Zmax)/2] correlates to mid-frequency f_min, which thus represents the nominal frequency. In a downspread modulation, Zmin corresponds to the nominal frequency; in an upspread modulation, maximum value Zmax corresponds to the nominal frequency. Number of measurements counter 13 is used to ignore the first, for example 16, cycle count values to avoid transient oscillation processes of measuring signal m. Furthermore, number of measurements counter 13 is used to define the time/measurement samples within which intermediate buffers 6a, 7a stabilize to their maximum/minimum values Zmin, Zmax.

Furthermore, a watchdog counter 11 is advantageously provided which also counts the number of SSO clock cycles and is reset by the signal edge of measuring signal m. In the case of a missing measuring signal m, in contrast to cycle counter 5, watchdog counter 11 counts only up to its maximum value and remains at its maximum counter value. This makes it possible to easily determine whether an expected measuring signal is present. Likewise, the value of this watchdog counter 11 may be tested for a valid value range. In this case, a suitable hysteresis may be applied which takes into account a tolerance of measuring signal m.

As an alternative to the aforementioned numerical values, a mid-frequency f_mid=55 MHz having a +/-2% spread, a measuring frequency of fm=100 kHz and a modulation frequency f_mod of, for example, 20 kHz may be provided, which achieves counter contents of approximately 500.

Figure 4:
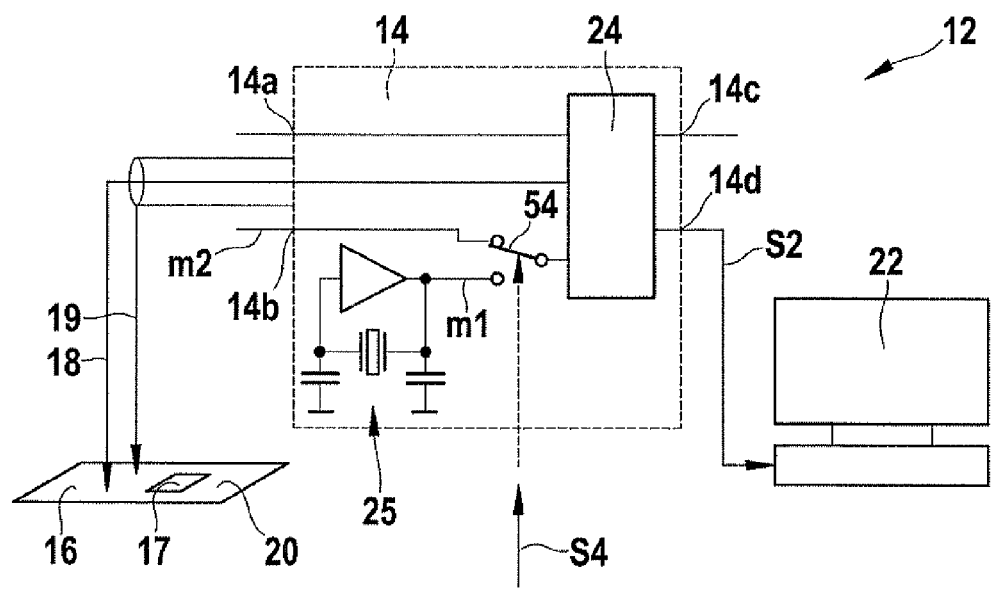
FIG. 4 shows a block diagram of a test system, in which the device according to the present invention is used as a standalone testing arrangement.

FIG. 4 shows a test system 12, in which a standalone testing arrangement 14 is provided, which may be used to externally test an electronic device 16 which has an SSO 17 indicated here. Electronic device 16 may be designed, for example, as a circuit having a circuit carrier 20, for example a PCB, i.e., printed circuit board (SSO 17) and, further appropriate components. In a manner which is known per se, contacts are provided via contacting arrangement 18, 19, for example needle adapters 18, 19, for tapping the signals from device 16, and the signals are thus output by testing arrangement 14.

Standalone testing arrangement 17 includes, for example, a power connection 14a, an input 14b for an external measuring signal m2, a ground connection 14c and a data output 14d for subsequent evaluation via a standard testing system 22, for example a further arithmetic unit 22. Testing arrangement 14 includes an FPGA 24 or another programmable switching unit, for example an ASIC 24, and also an internal clock generator 25, in particular oscillator 25, for outputting an internal measuring signal m1, it being possible to optionally switch FPGA 24 between this internal measuring signal m1 and external measuring signal m2 via an external switching signal (control signal) S4 which switches a switching unit 54. For example, a second clock source having a fixed frequency, which already exists in the system, may be used as internal clock generator 25, for example a second oscillator which may provide frequency division via a PLL which, for example, already exists in FPGA 24.

Thus, standalone testing arrangement 14, which may be designed, for example, as a testing unit having a housing, may be used to test electronic device 16, for example during final inspection or acceptance in manufacturing. An oscillator status output signal, for example, or even a PWM-encoded spread signal, may be output from output 14d as output signal S2.

The switchover between external measuring signal m2 and internal measuring signal m1 may be used for additional testing of internal measuring signal m1, or it may be optionally used if no external measuring signal m2 is available.

Figure 5:
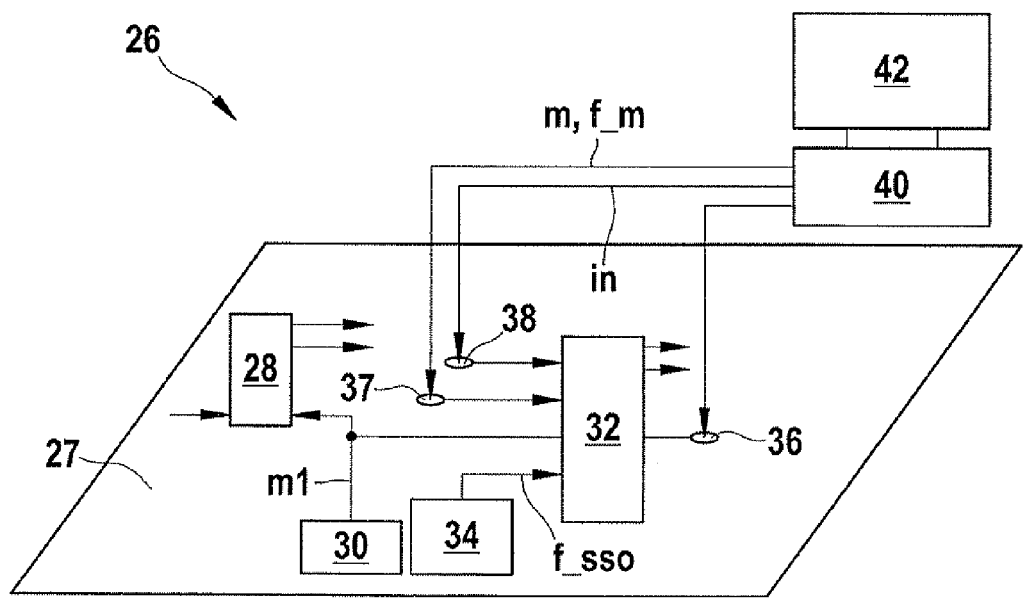
FIG. 5 shows an integration of the method into an electronic system for activation/evaluation only in manufacturing.

FIG. 5 shows the integration of the method according to the present invention into an electronic device 26, which includes a circuit carrier 27, for example a PCB, i.e., printed circuit board, and a microcontroller 28 mounted on circuit carrier 27, an oscillator 30 having a fixed clock pulse for outputting an internal measuring signal m1, an FPGA 32 or another similar component, and SSO 34, components 28, 30, 32, 34 being similarly designed as integrated circuits. FPGA 32 may be structured in the manner of FPGA 10 from FIG. 3. Contact surfaces 36, 37, 38 for tapping by an external testing apparatus 40, to which an evaluation unit 42 for a standard testing system is connected, are furthermore provided on circuit carrier 27. Contact surface 37 is used to supply measuring signal m from testing unit 40, and contact surface 38 is used to input an initialization signal into testing unit 40 for initializing the measurement. For example, the output signal of FPGA 32 may be output to contact surface 36 as the status output, for example as a binary signal or PWM signal.

Figure 6:
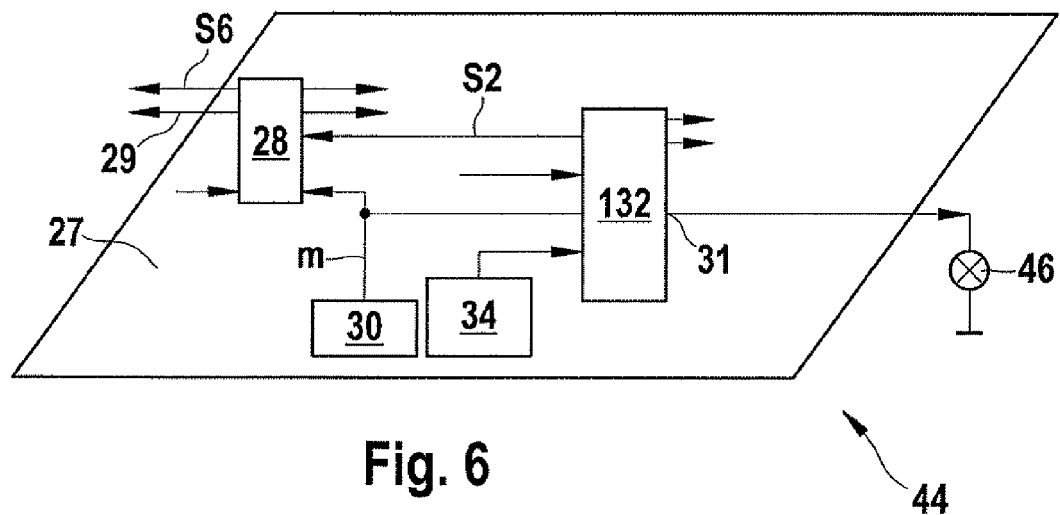
FIG. 6 shows an integration of the method according to the present invention into a device on a circuit carrier for activating/evaluating the measurement online during operation.

FIG. 6 shows an electronic device 44 which differs from device 26 from FIG. 5, while otherwise maintaining the same or a corresponding functionality, in that the testing apparatus or testing unit 40 and evaluation unit 42 from FIG. 5 are already integrated into FPGA 132, so that the measurement may be activated and evaluated directly online by the user, i.e., later in the field, for functionality tests at any time. In FIG. 6, an output signal S6 may be output externally by microcontroller 28, for example via a data bus 29; for use in a vehicle, this may be, for example, on-board CAN bus 29. FPGA 132 thus outputs output signal S2, for example as an oscillator status signal, to microcontroller 28, which outputs the corresponding output signal S6 to the outside. Furthermore, FPGA 132 may have a binary status output 31 to directly control an indicator to be connected externally, in particular a signal lamp 46, for direct indication of a functionality test, for example including control of the lamp during proper operation. Thus, operability may be indicated directly by signal lamp 46, and/or an error may be reported via an existing user interface, using output signal S6.

In FIGS. 5 and 6, measuring signal m may be used not only as a reset signal for FPGA 32 or 132, but it may also be used, as shown, as a clock signal for microcontroller 28 and, if necessary, for other components.

Figure 7:
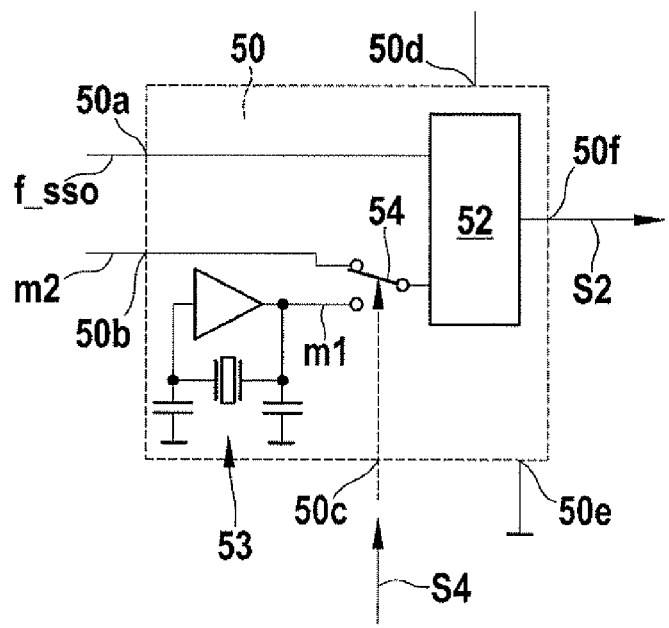
FIG. 7 shows the device as a standalone component.

FIG. 7 shows an implementation in a testing and evaluation circuit 52 according to the present invention, which is integrated into a semiconductor component. An internal oscillator 53 may also be integrated, a switching unit 54 switching between an internal measuring signal m1 output by oscillator 53 and an external measuring signal m2, which may be applied as needed. The SSO signal to be tested and having frequency f_sso is input into an input 50a, and the external measuring signal is input into an input 50b; switching signal S4 for switching between internal measuring signal m1 and external measuring signal m2 may furthermore be input via an input 50c; an input 50d for the power supply, a ground connection 50e and an output connection 50f for outputting an oscillator status output signal S2 are also provided. The functionality of integrated circuit 50 thus largely corresponds to the functionality of standalone testing arrangement 14 from FIG. 4.

Figure 8:
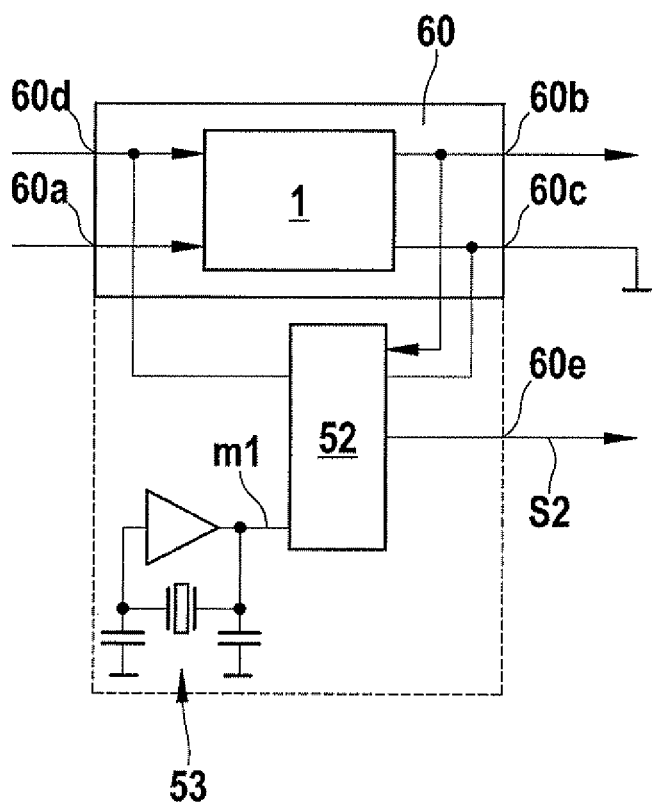
FIG. 8 shows the device according to the present invention, integrated with an SSO.

FIG. 8 shows testing and evaluation circuit 52 according to the present invention, which is integrated together with SSO 1 into a semiconductor component 60, i.e., as a common integrated circuit 60. SSO1 is thus additionally provided in the integrated circuit, as opposed to FIG. 7. For example, internal measuring signal m1 generated by oscillator 53 may be used alone. Integrated circuit 60 thus includes an input connection 60d for supplying power, an enable input 60a, a clock output 60b, a ground connection 60c and an oscillator status output 60e for outputting status output signal S2. In this case, the present invention is thus designed as a supplementary module in an oscillator IC 60.

Figure 9:
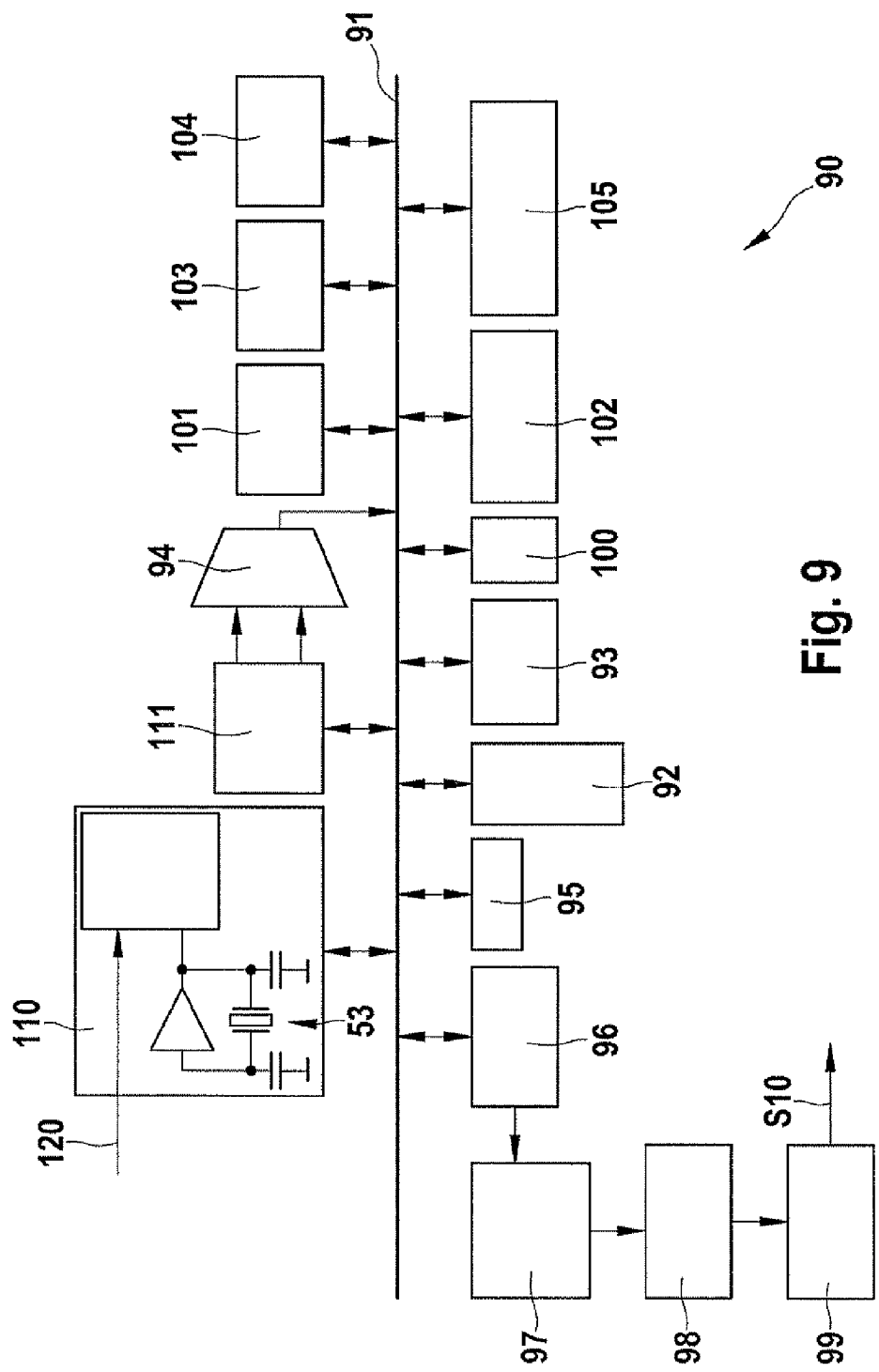
FIG. 9 shows the integration with a microcontroller.

FIG. 9 shows a further specific embodiment, in which the device according to the present invention is integrated into a microcontroller 90 as a peripheral module. A number of customary units are first connected to internal data bus 91 of controller 90, in particular an EEPROM 92, a timer/counter 93, an ALU (arithmetic logic unit) 94, an SRAM 95, a program counter 96, a flash program memory 97, an instruction register 98, an instruction decoder 99 for outputting control signals S10, an input/output unit (IO) 100, an interrupt unit 101, an analog comparator 102, a control register 103, a status register 104 as well as a universal serial interface 105, a general purpose register 111 and, if necessary, other customary units of a microcontroller. According to the present invention, an SSO monitoring module 110 is additionally provided, whose functions largely correspond to those of IC 50 from FIG. 7; internal oscillator 53 may be optionally provided, or another clock signal present in the microcontroller may be used. The SSO clock signal to be tested may be input, on the one hand, via an internal SSO of microcontroller 90, or it may be input by an external SSO via a clock input terminal 120.

Figure 10:
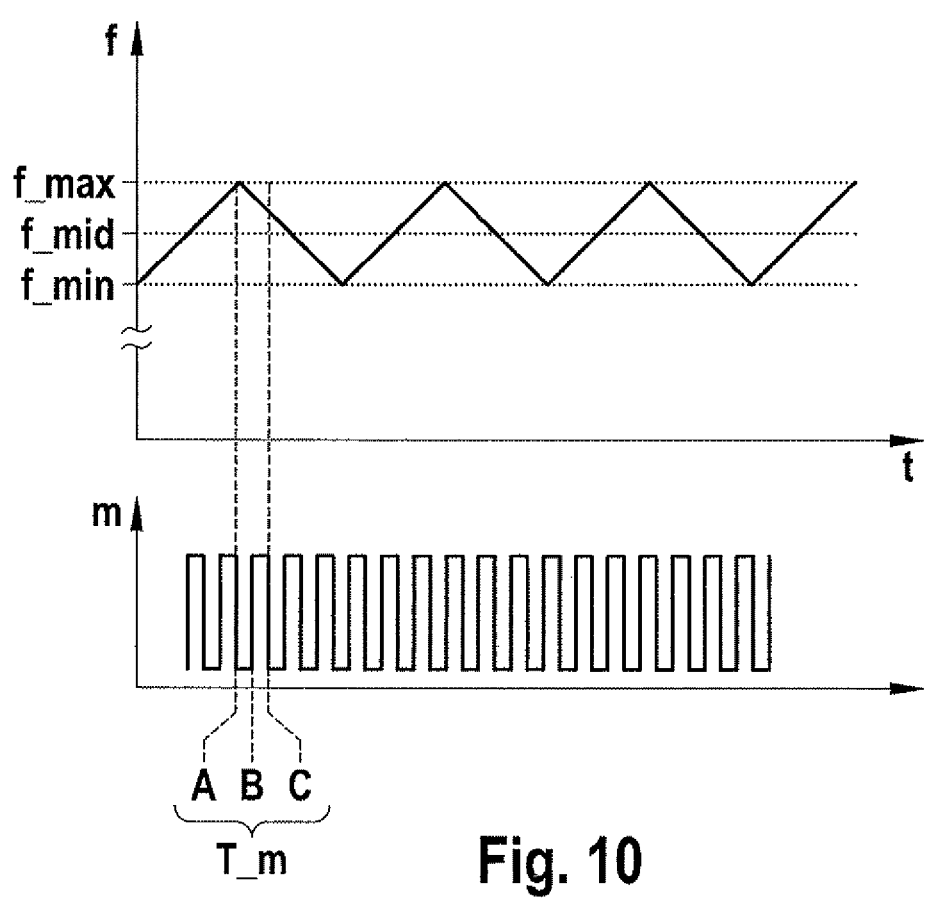
FIG. 10 shows the frequency modulation and details of the measuring signal for one implementation example.

FIG. 10 shows an implementation for monitoring measuring signal m with the aid of a watchdog-like counter, which cyclically counts the number of SSO cycles, starting from A or C, and stops on reaching its maximum counter value if it is not immediately reset at A or C. The period from A to C thus forms measuring period T_m.

The counter width in bits may be designed, for example, as $\log\{[\text{spread}*(f\_m-f\_mod)+2*f\_mid*f\_R]/[2*(f\_m)^2]\}/\log(2)$.

At point in time A or C, the watchdog counter is reset cyclically. If measuring signal m is missing, the watchdog counter overflows. This is detected and further processed as an error and taken into account in the result or in the result output. At point in time A or C, the watchdog counter status is checked for a validity range, including a hysteresis.

Figure 11:
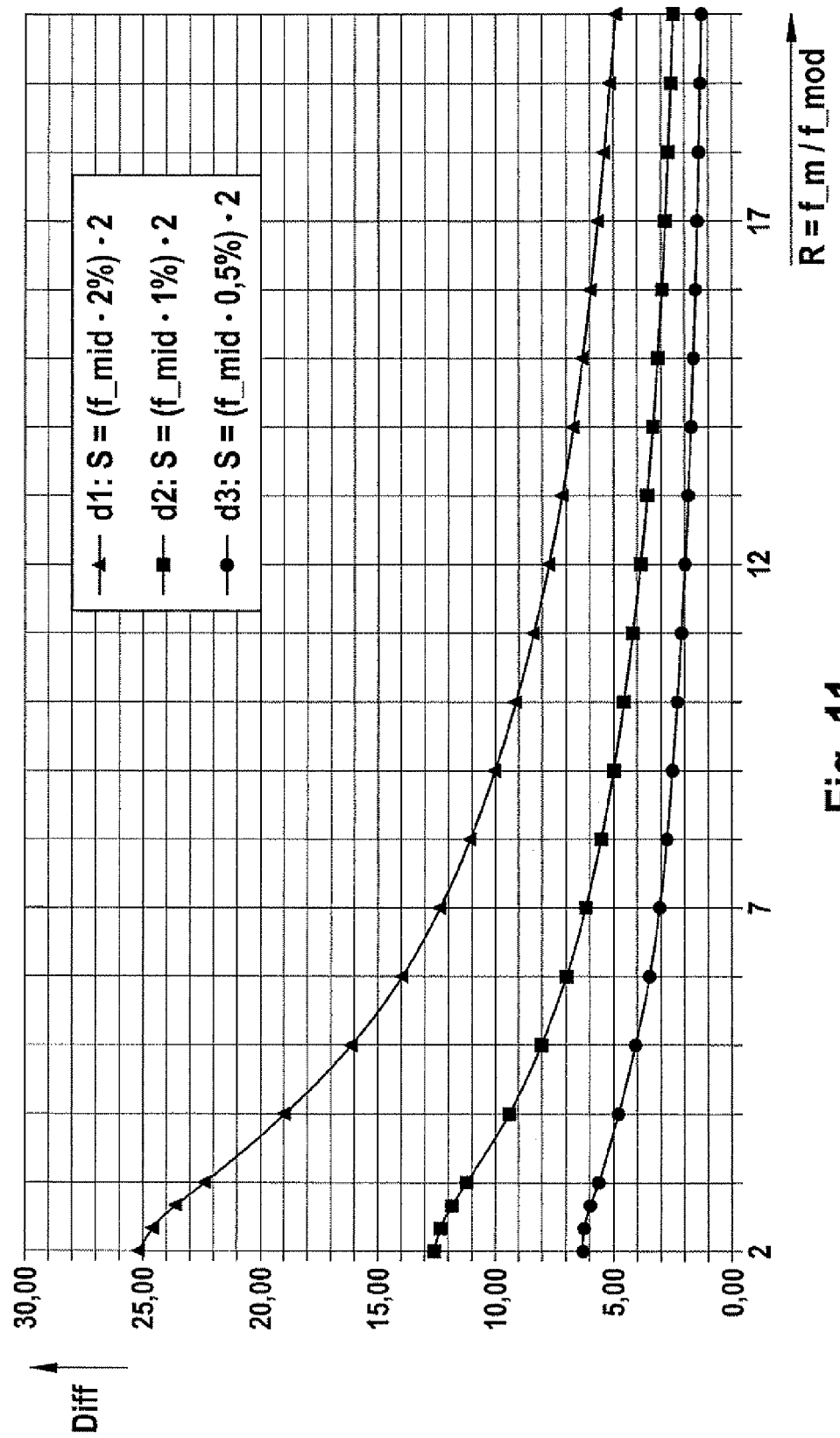
FIG. 11 shows the ascertained counter differences as a function of the measurement modulation frequency ratio in oscillators having different spreads.

FIG. 11 shows a diagram of counter difference Diff as a function of frequency ratio R, which is produced as the ratio between measuring frequency f_m and modulation frequency f_mod, for three oscillators having different spreads, namely according to curve d1 having a 2% spread, d2 having a 1% spread and d3=0.5% spread. The curves thus level off for higher values of R, so that it is best to select a lower value of R between 2 and 7. Measuring frequency f_m may be a non-integral multiple of f_mod, to thereby ensure that measuring periods T_m each cover different ranges of the modulation periods, i.e., the starting and ending times of measuring periods T_m do not always occur within the same phase values of the modulation periods.

What is claimed is:

1. A device for testing a frequency-modulated clock generator, comprising:
   a cycle counting unit that counts a total number of clock cycles of a clock signal of the clock generator occurring in each period of multiple consecutive measuring periods and outputs each total as a respective cycle count value; and
   a comparator device that receives the cycle count values, compares two of the cycle count values to each other, and outputs at least one output signal as a function of the comparison, the at least one output signal indicating whether the clock signal of the clock generator is being frequency-modulated.

2. A device for testing a frequency-modulated clock generator, comprising:
   a cycle counting unit for counting clock cycles of a clock signal of the clock generator in multiple consecutive measuring periods and for outputting cycle count values; and
   a comparator device for receiving and comparing the cycle count values and outputting at least one output signal as a function of the comparison;
   wherein the comparator device compares the ascertained cycle count values with each other and outputs the output signal for evaluating the frequency modulation as a function of the relative comparison.

3. The device of claim 1, wherein the at least one output signal includes information about at least one of a modulation frequency, a nominal frequency, and a relative spread of the clock signal.

4. A device for testing a frequency-modulated clock generator, comprising:
   a cycle counting unit for counting clock cycles of a clock signal of the clock generator in multiple consecutive measuring periods and for outputting cycle count values; and
   a comparator device for receiving and comparing the cycle count values and outputting at least one output signal as a function of the comparison;
   wherein the comparator device includes a memory unit for storing at least minimum and maximum cycle count values, and an evaluation unit for forming a difference between the minimum cycle count values and the maximum cycle count values and for outputting the output signal as a function of the ascertained difference.

5. The device of claim 4, wherein the memory unit includes an upper buffer memory for storing maximum cycle count values and a lower buffer memory for storing minimum cycle count values, the upper buffer memory having a maximum intermediate buffer and the lower buffer memory having a minimum intermediate buffer, the maximum intermediate buffer and the minimum intermediate buffer being updated after each measuring period, the minimum intermediate buffer being overwritten if the instantaneous cycle count value is less than the stored minimum cycle count value, and the maximum intermediate buffer being overwritten if the instantaneous cycle count value is greater than the maximum cycle count value stored therein.

6. The device of claim 5, wherein the lower buffer memory and the upper buffer memory each have a result buffer for accommodating the value stored in their intermediate buffers after a predetermined number of counting periods.

7. The device of claim 1, further comprising:
a number of measurements counter for counting the number of measuring periods, wherein the comparator device defines an evaluation period from multiple measuring periods counted by number of measurements counter, and wherein the comparator device uses the maximum cycle count values and minimum cycle count values ascertained within the evaluation period to ascertain the output signal.

8. The device of claim 7, wherein, at the start of a measurement, the evaluation period begins only after a predefined number of measuring periods counted by the number of measurements counter, and wherein the comparator device ignores the cycle count values ascertained in the preceding measuring periods for ascertaining the output signal.

9. A device for testing a frequency-modulated clock generator, comprising:
a cycle counting unit for counting clock cycles of a clock signal of the clock generator in multiple consecutive measuring periods and for outputting cycle count values; and
a comparator device for receiving and comparing the cycle count values and outputting at least one output signal as a function of the comparison;
wherein the measuring period is defined by a measuring signal which is supplied to a reset input of the cycle counter and which resets the cycle counter after a measuring period, a measuring frequency of the measuring signal being higher than the modulation frequency of the modulated clock signal.

10. The device of claim 9, wherein the measuring frequency is at least twice as high as the modulation frequency, which is lower than a nominal frequency of the clock generator.

11. The device of claim 9, wherein the measuring frequency of the measuring signal is a non-integral multiple of the modulation frequency between two and seven times the modulation frequency.

12. The device of claim 11, further comprising:
a watchdog counter which counts the number of clock cycles via which the measuring signal, which is an edge of the measuring signal, is reset, and if a measuring signal is missing, the watchdog counter counts only up to its predefined maximum counter value, the comparator device receiving the output signal of the watchdog counter for testing the measuring signal.

13. The device of claim 1, wherein the device is a programmable integrated circuit, which is one of an FPGA and ASIC.

14. The device of claim 13, wherein the integrated circuit includes an input for the frequency-modulated clock signal to be tested, an input for an external measuring signal for defining the measuring periods and an output for outputting the output signal.

15. The device of claim 14, wherein the integrated circuit also includes an internal clock generator for outputting an internal measuring signal and a switching unit which switches between the input for the external measuring signal and the internal clock generator.

16. The device of claim 13, wherein the device is an integrated circuit together with the frequency-modulated clock generator.

17. The device of claim 1, wherein the device is a peripheral module in a microcontroller.

18. The device of claim 1, wherein the testing of the frequency-modulated clock generator is started by a received external initialization signal.

19. The device of claim 1, wherein a binary signal for indicating at least one of the status and a data signal is output as the at least one output signal.

20. A testing unit for testing a frequency-modulated clock generator, comprising:
a circuit carrier;
a device for testing a frequency-modulated clock generator, including a cycle counting unit that counts a total number of clock cycles of a clock signal of the clock generator occurring in each period of multiple consecutive measuring periods and outputs each total as a respective cycle count value, and a comparator device that receives the cycle count values, compares two of the cycle count values to each other, and outputs at least one output signal as a function of the comparison, the at least one output signal indicating whether the clock signal of the clock generator is being frequency-modulated, wherein the device is an integrated circuit; and
an internal clock generator, wherein the device and the internal clock generator are mounted on the circuit carrier.

21. The testing unit of claim 20, further comprising:
a microcontroller provided on the circuit carrier, wherein the output signal of the device is output via at least one of a bus data line of the microcontroller and a binary status output of the device.

22. A method for testing a frequency-modulated clock signal, which is an SSO signal, the method comprising:
counting a total number of clock cycles of the frequency-modulated clock signal occurring in each period of consecutive measuring periods;
outputting each total as a respective cycle count value;
comparing two of the cycle count values ascertained in the measuring periods to each other; and
using the comparison, determining whether the frequency-modulated clock signal is being frequency-modulated.

23. The method of claim 22, wherein at least one of a modulation frequency, a nominal frequency, and a relative spread of the clock signal is at least one of ascertained and evaluated to determine whether the frequency-modulated clock signal is being modulated.

24. The method of claim 22, wherein the measuring periods are defined by the measuring frequency of a measuring signal, the measuring signal resetting a cycle counter which counts the clock cycles of the clock signal.

25. The method of claim 24, wherein a minimum cycle counter content and a maximum cycle counter content are ascertained via a predefined number of measuring periods, and at least one of the modulation frequency, the nominal frequency, and the relative spread of the clock signal is at least one of ascertained and evaluated from the minimum and maximum cycle counter contents.

26. The method of claim 22, wherein a watchdog count is carried out in which the clock cycles are counted so that the clock cycles are counted up to a maximum value if the measuring signal does not occur, and wherein the proper presence of the measuring signal is inferred from the counter contents of the watchdog counter.

27. The method of claim 22, wherein an evaluation based on a relative spread of the ascertained maximum counter contents and minimum counter contents with regard to a nominal frequency, which is a mid-frequency ascertained by averaging, are correlated, an ascertained relative spread being compared with a setpoint value, and the output signal being output as a function of the comparison for the purpose of indicating the status.

* * * * *